United States Patent
Yamada

(10) Patent No.: US 8,823,248 B2
(45) Date of Patent: Sep. 2, 2014

(54) FLEXURAL VIBRATION ELEMENT AND ELECTRONIC COMPONENT

(71) Applicant: Seiko Epson Corporation, Tokyo (JP)

(72) Inventor: Akinori Yamada, Ina (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 13/764,208

(22) Filed: Feb. 11, 2013

(65) Prior Publication Data

US 2013/0241364 A1 Sep. 19, 2013

Related U.S. Application Data

(60) Division of application No. 13/416,863, filed on Mar. 9, 2012, which is a continuation of application No. 12/647,868, filed on Dec. 28, 2009, now Pat. No. 8,217,556.

(30) Foreign Application Priority Data

Dec. 27, 2008 (JP) ................................. 2008-335550

(51) Int. Cl.
*H03H 9/21* (2006.01)
*H03H 9/05* (2006.01)
*H03H 9/10* (2006.01)

(52) U.S. Cl.
CPC ............... *H03H 9/0595* (2013.01); *H03H 9/21* (2013.01); *H03H 9/1021* (2013.01)
USPC ............................. 310/370; 310/352; 310/367

(58) Field of Classification Search
CPC ........ H03H 9/21; H03H 9/215; H03H 9/1021
USPC ......................................... 310/352, 367, 370
See application file for complete search history.

(56) References Cited

U.S. PATENT DOCUMENTS

| | | | |
|---|---|---|---|
| 5,747,691 A | * | 5/1998 | Yoshino et al. ............ 73/504.16 |
| 6,186,003 B1 | | 2/2001 | Kikuchi et al. |
| 6,227,048 B1 | | 5/2001 | Kikuchi et al. |

(Continued)

FOREIGN PATENT DOCUMENTS

| | | |
|---|---|---|
| JP | B 43-1194 | 1/1943 |
| JP | A 53-23588 | 3/1978 |

(Continued)

OTHER PUBLICATIONS

Itoh et al., "Analysis of Q-value of a quartz-crystal tuning-fork using thermoelastic equations," 36th EM Symposium, Kogakuin University, pp. 5-8, May 17, 2007 with Partial English-Language Translation.

(Continued)

*Primary Examiner* — Derek Rosenau
*Assistant Examiner* — Bryan Gordon
(74) *Attorney, Agent, or Firm* — Oliff PLC

(57) ABSTRACT

A flexural vibration element according to a first aspect of the invention includes: a vibration element body composed of a plurality of vibrating arms provided in parallel, a connecting part connecting the vibrating arms, and one central supporting arms extending between the vibrating arms from the connecting pert in parallel with the vibrating arms at equal distance from the arms and a frame body disposed outside the vibration element body.

7 Claims, 8 Drawing Sheets

(56) References Cited

U.S. PATENT DOCUMENTS

| | | | |
|---|---|---|---|
| 6,490,925 | B2 | 12/2002 | Inoue et al. |
| 6,587,009 | B2 | 7/2003 | Kitamura et al. |
| 6,651,498 | B1 | 11/2003 | Kikuchi et al. |
| 6,700,313 | B2 * | 3/2004 | Dalla Piazza et al. ........ 310/370 |
| 7,112,914 | B1 * | 9/2006 | Dalla Piazza et al. ........ 310/348 |
| 7,138,752 | B1 | 11/2006 | Dalla Piazza et al. |
| 7,531,945 | B2 | 5/2009 | Aratake |
| 7,579,748 | B2 | 8/2009 | Kuroda |
| 2001/0001928 | A1 | 5/2001 | Kikuchi et al. |
| 2003/0067248 | A1 | 4/2003 | Dalla Piazza et al. |
| 2006/0279176 | A1 * | 12/2006 | Dalla Piazza et al. ........ 310/348 |
| 2006/0279179 | A1 | 12/2006 | Piazza et al. |
| 2009/0152987 | A1 * | 6/2009 | Piazza ........................... 310/321 |
| 2010/0116052 | A1 | 5/2010 | Yanagisawa et al. |
| 2010/0156246 | A1 * | 6/2010 | Iwai ............................... 310/344 |

FOREIGN PATENT DOCUMENTS

| | | |
|---|---|---|
| JP | A 56-094813 | 7/1981 |
| JP | U 2-32229 | 2/1990 |
| JP | A 5-312576 | 11/1993 |
| JP | A 10-019577 | 1/1998 |
| JP | A-11-281372 | 10/1999 |
| JP | A 2001-183140 | 7/2001 |
| JP | A 2002-261575 | 9/2002 |
| JP | A 2004-260718 | 9/2004 |
| JP | A 2006-345519 | 12/2006 |
| JP | A-2009-130445 | 11/2009 |
| WO | WO 2008/114818 A1 | 9/2008 |

OTHER PUBLICATIONS

Itoh et al., "Analysis of Q-Value of Quartz Crystal Tuning Fork Using Thermoelastic Coupling Equations," Japanese Journal of Applied Physics, vol. 43, 2009.

Zener, "Internal Friction in Solids, I. Theory of Internal Friction in Reeds" Physical Review, vol. 52, Aug. 1, 1937, pp. 230-235.

Zener, "Internal Friction in Solids, II. General Theory of Thermoelastic Internal Friction," Physical Review, vol. 53, Jan. 1, 1938, pp. 90-99.

Zener et al., "Internal Friction in Solids, III. Experimental Demonstration of Thermoelastic Internal Friction," Physical Review, vol. 53, Jan. 1, 1938, pp. 100-101.

Roszhart, "The Effect of Thermoelastic Internal Friction on the Q of Micromachined Silicon Resonators," Solid-State Sensor and Actuator Workshop, Technical Digest IEEE, Jan. 4, 1990, pp. 13-16.

Office Action dated Nov. 21, 2011 issued in U.S. Appl. No. 12/647,868.

Notice of Allowance dated Mar. 2, 2012 issued in U.S. Appl. No. 12/647,868.

Office Action dated Jan. 18, 2013 issued in U.S. Appl. No. 13/416,863.

Office Action dated Jul. 3, 2013 issued in U.S. Appl. No. 13/416,863.

Office Action dated Oct. 29, 2013 issued in U.S. Appl. No. 13/416,863.

Notice of Allowance dated Apr. 8, 2014 issued in U.S. Appl. No. 13/416,863.

* cited by examiner

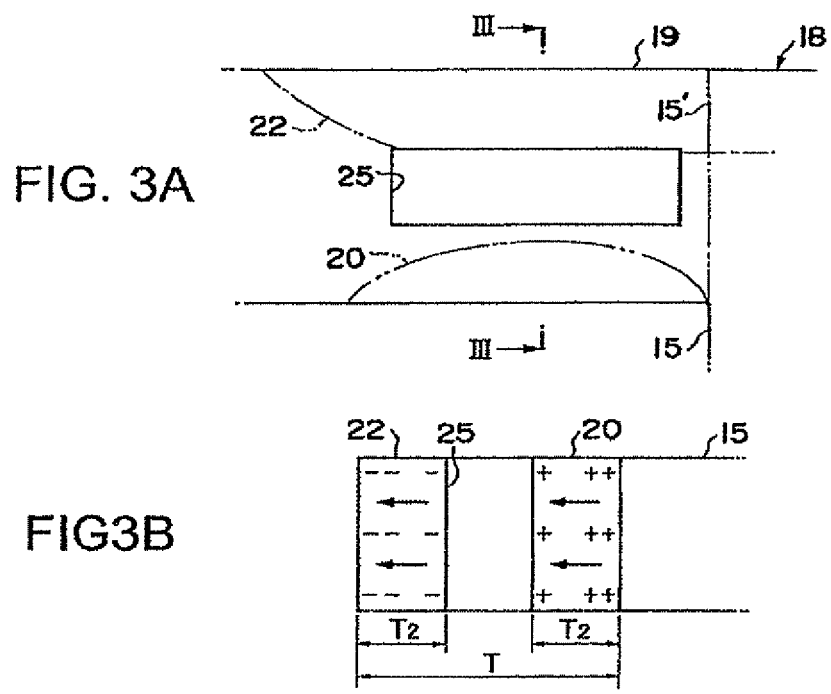
FIG. 3A
FIG3B
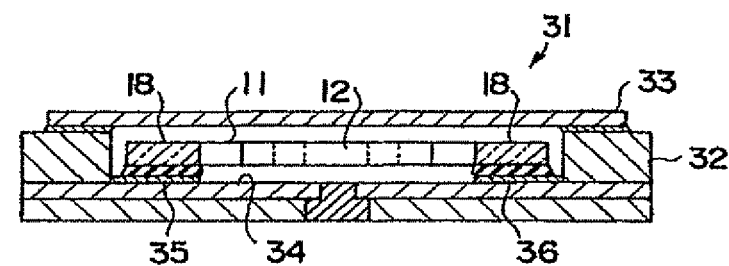
FIG. 4

FLEXURAL VIBRATION ELEMENT AND ELECTRONIC COMPONENT

This is a divisional of application Ser. No. 13/416,863 filed Mar. 9, 2012 which is a continuation of application Ser. No. 12/647,868 filed Dec. 28, 2009. The disclosure of the prior application is hereby incorporated by reference herein in its entirety.

BACKGROUND

1. Technical Field

The present invention relates to a flexural vibration element which vibrates in a flexural vibration mode, and various electronic components including the flexural vibration element, such as a vibrator, a resonator, an oscillator gyro, and various sensors.

2. Related Art

As a piezoelectric vibration element in a flexural vibration mode, such a tuning fork type piezoelectric vibration element has been widely used that a pair of vibrating arms is extended in parallel from a base part and the vibrating arms vibrate closer to or away from each other in a horizontal direction. Vibration energy loss generated when the vibrating arms perform flexural vibration causes degradation of performances of a vibrator such as increase of a CI value and decrease of a Q value. Therefore, various ways for preventing or reducing the vibration energy loss has been contrived.

JP-A-2002-261575 as a first example and JP-A-2004-260718 as a second example disclose a tuning fork type quartz crystal vibration element in which cuts or cut-grooves having a predetermined depth are formed at both side parts of a base part from which vibrating arms extend. In the quartz crystal vibration element, even in a case where the vibrating arms generate vibration including a vertical component, vibration leak from the base part is suppressed by the cuts or the cut-grooves so as to improve a trapping effect of the vibration energy and prevent variation of CI values among vibration elements.

Not only such the mechanical loss but also vibration energy loss is generated by heat conduction due to temperature difference between a compressive part and an extending part, which receives tensile stress, of the vibrating arms which performs flexural vibration. Decrease of the Q value caused by the heat conduction is called a thermoelastic effect. In order to prevent or suppress the decrease of the Q value due to the thermalelastic effect, Japanese Patent Application No. 63-110151 as a third example proposes a tuning fork type vibrator, in which a groove or a hole is formed on a centerline of a vibrating arm (vibrating beam) having a rectangular section.

The third example describes that the Q value becomes minimum when a relaxation frequency fm is expressed as fm=1/(2πτ) (here, π denotes circle ratio, τ denotes relaxation time) in a vibrator in a flexural vibration mode. This is based on a relational equation of distortion and stress which is known in a case of internal friction, which is generally caused by temperature difference, of a solid substance. A relationship between a Q value and a frequency is generally expressed as a curve F of FIG. 10 (refer to, for example, C. Zener et al., "Internal Friction in Solids III. Experimental Demonstration of Thermoelastic Internal Friction", Physical Review, Volume 53, pp. 100-101 (January 1938)). Referring to FIG. 10, the Q value becomes a minimum value Q0 at a relaxation frequency f0 (=1/(2πτ)).

Here, it is also known that the relaxation frequency f0 can be obtained from the following formula.

$$f0 = \pi k/(2\rho C_p a^2) \quad (1)$$

Here, π denotes circle ratio, k denotes a thermal conductivity in vibration direction of the vibration part (flexural vibration part), ρ denotes a mass density of the vibration part (flexural vibration part), $C_p$ denotes a heat capacity of the vibration part (flexural vibration part), and a denotes a width of the vibration part (flexural vibration part).

Further, JP-A-53-23588 as a fourth example discloses a quartz crystal vibrator in which a tuning fork type oscillation element having two vibrating arms is formed to be integrated with a holding frame, which surrounds the oscillation element and has a rectangular shape, at a connecting part formed on a base part of the oscillation element. The quartz crystal vibrator having such the structure is sealed by sandwiching the holding frame by planar covers from a top and a bottom. Further, JP-A-56-94813 as a fifth example discloses a tuning fork type piezoelectric vibrator in which a vibrator and a rectangular supporting frame are connected by an elastic member provided on a lateral surface of a base part of the vibrator so as to suppress leak of vibration energy of vibrating arms from the base part to an outside.

On the other hand, as a flexural vibrator other than that of a tuning fork type, JP-A-2006-345519 as a sixth example discloses a resonator in which two parallel vibrating arms are coupled to each other by a connecting part and a central arm is extended between the vibrating arms from the connecting part. The resonator is composed of a single-component vibration element made of quartz crystal. In the resonator, at least one groove is formed on at least one of a front surface and a rear surface of the vibrating arms so as to make an excitation electric field even and regionally-strong, reducing energy consumption and limiting a CI value. Further, the groove of the vibrating arms is extended to the connecting part, at which mechanical stress is maximum, and an electric field is extracted at this region so as to increase a vibration coupling effect of the vibrating arms.

Vibration elements vibrating in the flexural vibration mode include a vibration element of an electrostatic driving type using electrostatic force and a vibration element of a magnetic driving type using magnetism as well as the vibration element of the piezoelectric driving type described above. JP-A-5-312576 as a seventh example discloses an angular velocity sensor as a vibration element of the electrostatic driving type. In the angular velocity sensor, a first vibrating body composed of a square frame part is supported by a first supporting beam so as to be able to vibrate in X-axis direction, and a second vibrating body having a square plain plate shape is supported by a second supporting beam so as to be able to vibrate in Y-axis direction, on a substrate made of a silicon material. The first supporting beam bends due to electrostatic force which is generated between a fixed conductive part provided on an end part of the substrate and a movable conductive part provided on an end part of the first vibrating body. Thus the first vibrating body vibrates in the X-axis direction. JP-A-2001-183140 as an eighth example discloses another angular velocity sensor as another vibration element of the electrostatic driving type. This angular velocity sensor is composed of a sensor body made of a silicon wafer and a glass substrate opposed to the sensor body. The sensor body has plummets provided to an inside of a vibration frame, which is supported in a fixed frame by a driving beam, by multiple beams. The sensor body and the plummets vibrate due to electrostatic force generated between parallel plain plate electrodes provided on the sensor body and the glass substrate.

Further, JP-B-43-1194 as a ninth example discloses a vibrating body structure as a vibration element of the magnetic driving type. In the vibrating body structure, a vibrating body made of a constant modulus material is fixed and supported on an external fixing pedestal at its supporting part at one end thereof. A spring part branched from a connecting part between the vibrating body and the pedestal is driven and vibrated by magnet fixed to a free end of the spring part and by an electromagnetic coil fixed to a base. JP-A-10-19577 as a tenth example discloses an angular velocity sensor as another vibration element of the magnetic driving type. In the angular velocity sensor, a thin film magnet is disposed on a thin film vibrating plate which is composed of a silicon substrate and is supported as a cantilever beam. The thin film vibrating plate is vibrated in a thickness direction by an effect of electromagnetic force generated by applying alternating current to a conductor or an electromagnetic coil provided outside the thin film vibrating plate.

The inventor studied a means for suppressing vibration energy loss of vibrating arms in a piezoelectric vibration element having such a structure that one central supporting arm was extended from a connecting part between the two vibrating arms as illustrated in the sixth example. Especially, as far as the inventor knows, almost only the third example studies an influence of the above-mentioned thermoelastic effect given to the piezoelectric vibration element in a flexural vibration mode, among related arts.

FIG. 11A shows a typical example of a piezoelectric vibration element having a related art structure including one central supporting arm. This piezoelectric vibration element 1 includes two vibrating arms 3 and 4 extending from a connecting part 2 in parallel. Between the vibrating arms 3 and 4, one central supporting arm 5 extends in parallel with the arms 3 and 4 at equal distance from the arms 3 and 4. A linear groove 6 is formed on each of a front surface and a rear surface of the vibrating arm 3 and a linear groove 7 is formed on each of a front surface and a rear surface of the vibrating arm 4. The piezoelectric vibration element 1 is fixed and held on a mount part 8 of a package or the like, which is not shown, at an end part 5a, which is opposite to an end at the connecting part, of the central supporting arm 5. When a predetermined voltage is applied to an excitation electrode, which is not shown, in this state, the vibrating arms 3 and 4 perform flexural vibration in a direction closer to or away from each other as shown by arrows in the drawing.

Because of this flexural vibration, mechanical-compressive/-tensile distortion occurred at the central supporting arm 5 in a longitudinal direction of the arm 5. The distortion was observed as temperature-increase and temperature-decrease occurring in the central supporting arm 5. As shown in FIG. 11B, when the vibrating arms 3 and 4 bend in a direction away from each other, the whole of the connecting part 2 bends toward the end part 5a of the central supporting arm 5. Therefore, the central supporting arm 5 receives stress compressing the arm 5 toward the end part 5a. In an opposite manner, when the vibrating arms 3 and 4 bend in a direction coming closer to each other, the connecting part 2 bends toward an opposite side of the end part 5a of the central supporting arm 5 as shown in FIG. 11C. Therefore, the central supporting arm 5 receives stress pulling the arm 5 toward the opposite side of the end part 5a.

As a result, part of the flexural vibration of the vibrating arms 3 and 4 goes off from the central supporting arm 5 to the mount part 8, that is, mechanical vibration leak occurs, causing increase of a CI value and decrease of a Q value. Thus performance of a vibrator may be degraded. Further, compressive/tensile stress acting on the central supporting arm 5 generates temperature gradient inside the piezoelectric vibration element 1. As a result, vibration energy loss due to the thermoelastic loss may be generated.

SUMMARY

An advantage of the present invention is to provide such a flexural vibration element in a flexural vibration mode that mechanical loss and/or thermoelastic loss of vibration energy of a plurality of vibrating arms are/is suppressed and performance thereof is improved. In the flexural vibration element, one central supporting arm extends from a connecting part between the vibrating arms.

A flexural vibration element according to a first aspect of the invention includes: a vibration element body composed of a plurality of vibrating arms provided in parallel, a connecting part connecting the vibrating arms, and one central supporting arm extending between the vibrating arms from the connecting part in parallel with the vibrating arms at equal distance from the arms; and a frame body disposed outside the vibration element body. In the flexural vibration element, the vibration element body is supported by the frame body at an end part, which is opposite to the connecting part, of the central supporting arm.

The connecting part of the vibration element body bends and vibrates due to the flexural vibration of the vibrating arms and therefore the compressive stress or the tensile stress acts along the central supporting arm in a longitudinal direction, bending and deforming the connecting portion of the frame body with the central supporting part. However, the flexural vibration hardly acts on other portions of the frame body. Therefore, when the flexural vibration element of the first aspect is fixed and supported on a package or the like at a portion other than the connecting portion of the frame body with the central supporting arm, vibration leak of the vibrating arms toward the outside can be suppressed. Thus the performance of the flexural vibration element can be improved.

The flexural vibration element of the invention may be a piezoelectric vibration element of a piezoelectric driving type which is used in a vibrator, a resonator, a gyro, a piezoelectric device such as various sensors, and other electronic components. Further, the flexural vibration element of the invention may be a flexural vibration element of an electrostatic driving type and that of a magnetic driving type.

In the flexural vibration element of the aspect, the end part, opposite to the connecting part, of the central supporting arm may be directly connected with one side part of the frame body so as to support the vibration element body. Though the side part receives the compressive stress or the tensile stress due to the flexural vibration of the vibrating arms so as to bend and deform, other side parts are hardly influenced by the flexural vibration. Therefore, vibration leak of the vibrating arms toward the outside can be suppressed by fixing and supporting the flexural vibration element on a package or the like at other side parts.

In the flexural vibration element of the aspect, the side part, which is connected with the central supporting arm, of the frame body may have a groove formed on at least one of a front surface and a rear surface thereof, and the groove may be positioned in an area that is along the side part and in which compressive stress and tensile stress alternately occur at an inner side and an outer side in a width direction of the side part due to flexural vibration of the vibrating arms. In the side part, temperature-increase due to compression and temperature-decrease due to extension alternately occur at the inner side and the outer side in the width direction of the side part so as to generate temperature difference between the inner side and the outer side, but heat transfer between the inner side and the outer side can be limited by the groove provided on the side part. Accordingly, decrease of a Q value due to thermoelastic loss is suppressed, being able to achieve higher performance of the flexural vibration element.

In the flexural vibration element of the aspect, the groove may be formed between one end of the side part and a part of the same to which the central supporting arm is connected and between the other end of the side part and the part to which the central supporting arm is connected. Accordingly, the thermoelastic loss can be effectively decreased and the Q value can be improved without losing strength and rigidity of the side part.

In the flexural vibration element of the aspect, the groove of the side part may have a bottom. Therefore, a heat transfer path between the inner side and the outer side in the width direction of the side part is narrowed at an intermediate part thereof, which is equivalent to elongating the heat transfer path. As a result, a relaxation time $\tau$ during which the temperature becomes an equilibrium condition between the inner side and the outer side of the side part becomes long. Therefore, a relaxation vibration frequency ($f=1/(2\pi\tau)$) at the minimum Q value is lower than that in a case where the side part does not have a groove. In a range that the relaxation vibration frequency is higher than that in the case without any groove, the Q value is higher.

In the flexural vibration element of the aspect, the groove of the side part may be a through groove. Accordingly, the heat transfer path between the inner side and the outer side in the width direction of the side part is cut at an intermediate part thereof so as to be shorter than that in a related art structure. As a result, a relaxation time $\tau$ during which the temperature becomes an equilibrium condition between the inner side and the outer side in the width direction of the side part becomes short. Therefore, a relaxation vibration frequency ($f=1/(2\pi\tau)$) at the minimum Q value is higher than that in a case where the side part does not have a groove. In a range that the relaxation vibration frequency is lower than that in the case without any groove, the Q value is higher.

In the flexural vibration element of the aspect, the frame body may have a supporting part, at an interior side thereof, extending between a pair of side parts thereof, and the end part, opposite to the connecting part, of the central supporting arm may be connected to the supporting part so as to support the vibration element body. Though the supporting part receives the compressive stress or the tensile stress due to the flexural vibration of the vibrating arms so as to bend and deform, side parts of the frame body are hardly influenced by the flexural vibration. Therefore, vibration leak of the vibrating arms toward the outside can be suppressed by fixing and supporting the flexural vibration element on a package or the like at the side parts.

In the flexural vibration element of the aspect, the supporting part of the frame body may have a groove formed on at least one of a front surface and a rear surface thereof, and the groove may be positioned in an area that is along the supporting part and in which compressive stress and tensile stress alternately occur at a vibration element body side of the supporting part and an opposite side to the vibration element body side due to flexural vibration of the vibrating arms. In the supporting part, temperature-increase due to compression and temperature-decrease due to extension alternately occur at the vibration element body side and the opposite side in the width direction of the supporting part so as to generate temperature difference between the vibration element body side and the opposite side, but heat transfer between the vibration element body side and the opposite side can be limited by the groove provided on the supporting part. Accordingly, decrease of a Q value due to thermoelastic loss is suppressed, being able to achieve higher performance of the flexural vibration element.

In the flexural vibration element of the aspect, the groove may be formed between one end of the supporting part and a part of the same to which the central supporting arm is connected and between the other end of the supporting part and the part to which the central supporting arm is connected. Accordingly, the thermoelastic loss can be effectively decreased and the Q value can be improved without losing strength and rigidity of the supporting part.

In the flexural vibration element of the aspect, the groove of the supporting part may have a bottom. Therefore, a heat transfer path between the vibration element body side and the opposite side of the vibration element body side of the supporting part is narrowed at the intermediate part thereof, which is equivalent to elongating the heat transfer path. As a result, a relaxation time $\tau$ during which the temperature becomes an equilibrium condition between the vibration element body side and the opposite side of the supporting part becomes long. Therefore, a relaxation vibration frequency ($f=1/(2\pi\tau)$) at the minimum Q value is lower than that in a case where the supporting part does not have a groove. In a range that the relaxation vibration frequency is higher than that in the case without any groove, the Q value is higher.

In the flexural vibration element of the aspect, the groove of the supporting part may be a through groove. Accordingly, the heat transfer path between the vibration element body side and the opposite side of the vibration element body side of the supporting part is cut at an intermediate part thereof so as to be shorter than that in a related art structure. As a result, a relaxation time $\tau$ during which the temperature becomes an equilibrium condition between the vibration element body side and the opposite side of the supporting part becomes short. Therefore, a relaxation vibration frequency ($f=1/(2\pi\tau)$) at the minimum Q value is higher than that in a case where the supporting part does not have a groove. In a range that the relaxation vibration frequency is lower than that in the case without any groove, the Q value is higher.

An electronic component according to a second aspect of the invention includes: the flexural vibration element of the first aspect; a base on which the flexural vibration element is disposed; and a lid bonded with the base. In the electronic component, the flexural vibration element is fixed to the base at a side part that is different from a side part to which the central supporting arm of the frame body is connected, and is air-tightly sealed in a space formed by the base and the lid. Thus an electronic component such as a piezoelectric device having a higher Q value and exhibiting higher performance than a related art is provided.

An electronic component according to a third aspect of the invention includes: the flexural vibration element of the first aspect; a base bonded to a lower surface of the frame body of the flexural vibration element; and a lid bonded to an upper surface of the frame body. In the electronic component, the flexural vibration element is air-tightly sealed in a space formed by the base and the lid. Thus an electronic component such as a piezoelectric device having a higher Q value and exhibiting higher performance than a related art is provided.

BRIEF DESCRIPTION OF THE DRAWINGS

The invention will be described with reference to the accompanying drawings, wherein like numbers reference like elements.

FIG. 3A is a partially-enlarged plan view showing a side part of a frame body of a piezoelectric vibration element of a second modification of the first embodiment. FIG. 3B is a sectional view taken along a III-III line of the FIG. 3A.

FIG. 4 is a longitudinal sectional view showing a piezoelectric device provided with the piezoelectric vibration element of the first embodiment.

DESCRIPTION OF EXEMPLARY EMBODIMENTS

Figure 1A:
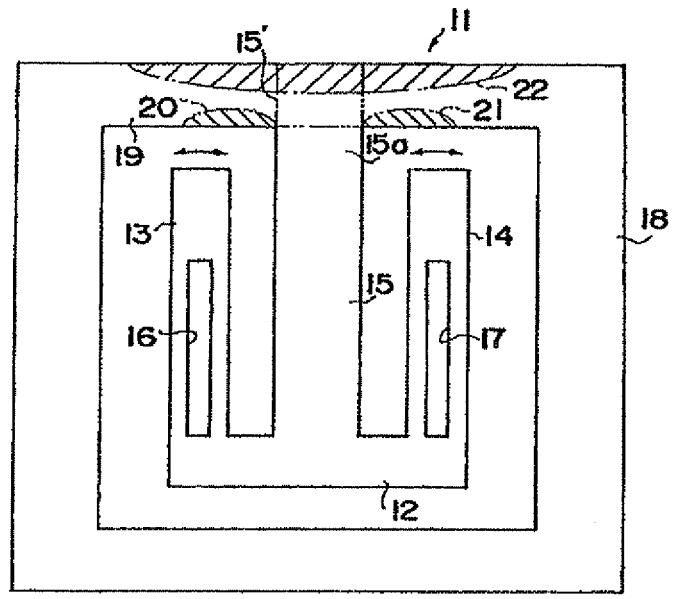
FIG. 1A is a plan view showing a piezoelectric vibration element of a first embodiment of the invention.

Preferred embodiments of the invention will now be described with reference to the accompanying drawings. Here, elements common in the drawings have the same reference numerals.

First Embodiment

FIG. 1A is a schematic view showing a structure of a piezoelectric vibration element, according to a first embodiment, to which the present invention is applied. A piezoelectric vibration element 11 according to the first embodiment includes a vibration element body composed of a connecting part 12, two vibrating arms 13 and 14 which extend from the connecting part 12 in parallel, and one central supporting arm 15. The central supporting arm 15 extends from the connecting part 12 between the vibrating arms 13 and 14 in parallel with the arms 13 and 14 at equal distance from the arms 13 and 14. A linearly shaped long groove 16 is formed on each of a front surface and a rear surface of the vibrating arm 13 and a linearly shaped long groove 17 is formed on each of a front surface and a rear surface of the vibrating arm 14, so as to control a crystal impedance (CI) value.

The piezoelectric vibration element 11 further includes a frame body 18 having a rectangular shape and disposed at the outside of the vibration element body. The central supporting arm 15 is integrally connected with one side part 19 of the frame body 18 at an end part 15a thereof which is positioned opposite to the connecting part 12. Thus, the vibration element body is supported by the frame body 18 like a cantilever. The frame body 18 may be formed to have round corners or chamfered edges.

The piezoelectric vibration element 11 is composed of a so-called Z-cut quartz crystal thin plate in which Y-axis of a quartz crystal axis is oriented in a longitudinal direction of the vibrating arms, X-axis is oriented in a width direction of the same, and Z-axis is oriented in an orthogonal direction of the front surface and the rear surface of the vibration element, like a related art tuning-fork type quartz crystal vibration element. The piezoelectric vibration element 11 may be made of a piezoelectric material other than quartz crystal.

Though it is not shown, an excitation electrode is formed on surfaces, including inner surfaces of the grooves 16 and 17, of the vibrating arms 13 and 14. When predetermined voltage is applied to the excitation electrode in a state that the vibration element body is supported by the frame body 18 at the central supporting arm 15 thereof as a cantilever as described above, the vibrating arms 13 and 14 bend and vibrate closer to and away from each other in a horizontal direction as shown by arrows in the drawing.

Figure 1B:
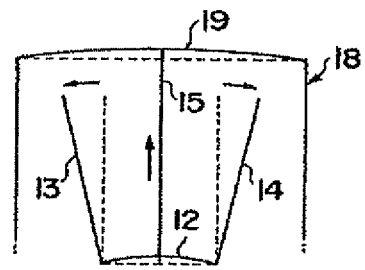
FIGS. 1B and 1C are schematic views showing deformation of vibrating arms due to flexural vibration.

Because of the flexural vibration of the vibrating arms 13 and 14, the side part 19 of the frame body 18 bends and deforms in the horizontal direction. As shown in FIG. 1B, when the vibrating arms 13 and 14 bend in a direction away from each other, the whole of the connecting part 12 bends toward the end part 15a of the central supporting arm 15. Accordingly, the central supporting arm 15 receives stress compressing the arm 15 toward the end part 15a side, bending the side part 19 toward the outside of the frame body 18. Here, compressive stress acts along an inner side, in a width direction, of the side part 19, especially, acts on parts 20 and 21 close to a part 15' at which the central supporting arm 15 is connected with the frame body 18. Tensile stress acts along an outer side, in the width direction, of the side part 19, especially acts on a part 22 which has relatively a large area from the part 15' as a center toward the both ends of the side part.

Figure 1C:
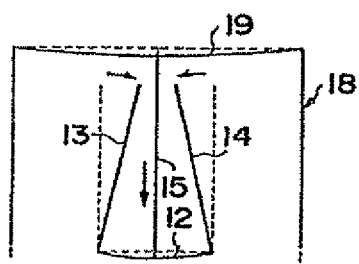

In an opposite manner, as shown in FIG. 1C, when the vibrating arms 13 and 14 bend in a direction in which the arms come closer to each other, the whole of the connecting part 12 bends in an opposite direction to a direction toward the end part 15a of the central supporting arm 15. The central supporting arm 15 receives stress pulling the arm 15 from the end part 15a side, bending the side part 19 toward the inside of the frame body 18. Therefore, tensile stress acts along the inner side, in a width direction, of the side part 19, especially, acts on the parts 20 and 21 close to the part 15' at which the central supporting arm 15 is connected with the frame body 18. Compressive stress acts along the outer side, in the width direction, of the side part 19, that is, acts on the part 22, which has relatively a large area, from the part 15' as a center toward the both ends of the side part.

In contrast, compressive stress and tensile stress hardly occur at a connecting portion between the side part 19 and an adjacent side part of the frame body 18 and the surrounding part of the connecting portion. Accordingly, when the frame body 18 is fixed to a package or the like at a side part except for the side part 19 in the piezoelectric vibration element 11, vibration leak of the vibrating arms can be prevented or suppressed. Thus performance of the piezoelectric vibration element 11 can be improved.

First Modification of First Embodiment

Figure 2A:
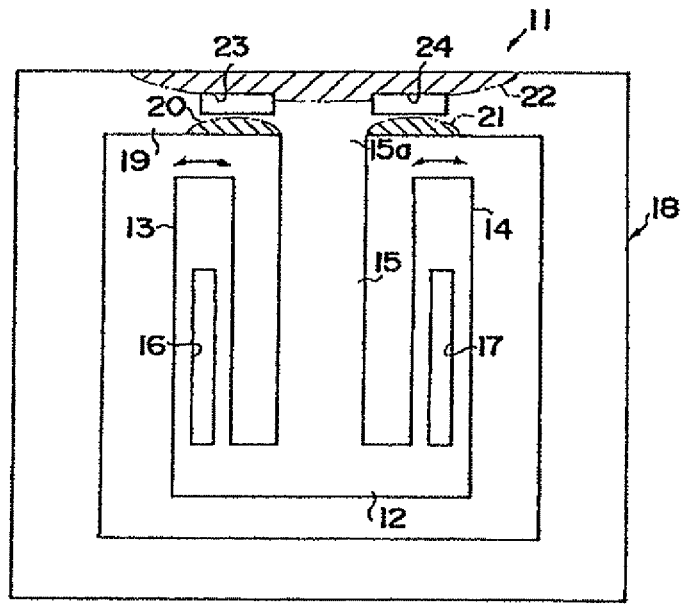
FIG. 2A is a plan view showing a piezoelectric vibration element of a first modification of the first embodiment.
Figure 2B:
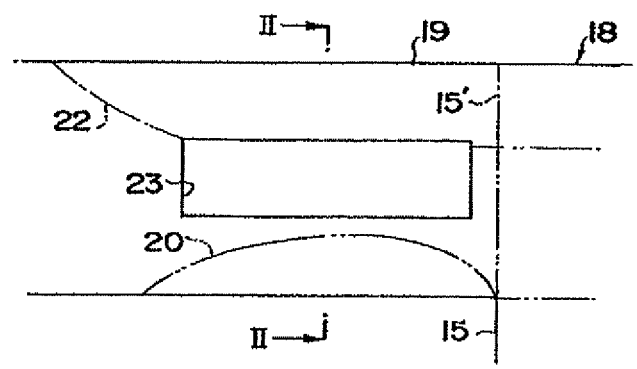
FIG. 2B is a partially-enlarged plan view showing a side part of a frame body.
Figure 2C:
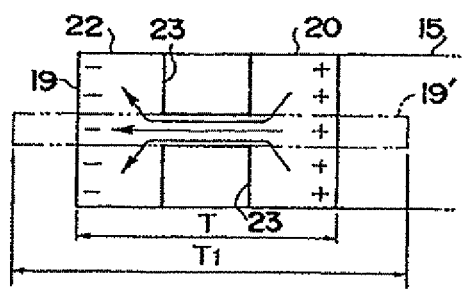
FIG. 2C is a sectional view taken along a II-II line of FIG. 2B.

FIGS. 2A to 2C show a first modification of the first embodiment. A piezoelectric vibration element 11 of the first modification differs from the piezoelectric vibration element 11 of the first embodiment at a point that the element of the first modification has grooves 23 and 24 along the side part 19 of the frame body 18. The groove 23 is disposed between the part 20 at the inner side, in the width direction, of the side part 19 and the part 22 at the outer side of the same, at the same distance from peripheries of the side part 19, and the groove 24 is disposed between the part 21 at the inner side and the part 22, at the same distance from peripheries of the side part 19. As described in the first embodiment, compressive stress and tensile stress occur alternately in the side part 19 due to the flexural vibration of the vibrating arms 13 and 14.

FIG. 2C shows a case where the vibrating arms bend away from each other, and accordingly the part 20 (21) at the inner side in the width direction of the side part 19 becomes a compressive side and the part 22 at the outer side becomes a tensile side. As shown in FIG. 2C, the grooves 23 and 24 have bottoms at the same depths from each of the front and rear surfaces of the side part. In the drawing, + denotes temperature-increase, and − denotes temperature-decrease. Across the groove 23 (24), a temperature increases at the part 20 (21) at the compressive side and a temperature decreases at the part 22 at the tensile side. Because of this temperature gradient, heat transfers from the part 20 (21) at the compressive side (+) through a part at the groove 23 (24) to the part 22 at the tensile side (−).

In an opposite manner, when the vibrating arms bend closer to each other, the parts 20 and 21 at the inner side in the width direction of the side part 19 become a tensile side, and the part 22 at the outer side becomes a compressive side. The temperature increases at the part 22 at the compressive side, and the temperature decreases at the parts 20 and 21 at the tensile side. Because of this temperature gradient, heat transfers from the part 22 at the compressive side respectively through parts at the grooves 23 and 24 to the parts 20 and 21 at the tensile side. Thus, the temperature gradient is generated between the part 20 at the inner side in the width direction of the side part 19 and the part 22 at the outer side and between the part 21 at the inner side and the part 22 depending on a direction in which the vibrating arms bend closer to or away from each other, and the heat transfer occurs depending on the temperature gradient.

A heat transfer path between the part 20 and the part 22 and a heat transfer path between the part 21 and the part 22 are narrowed at intermediate parts thereof by the grooves 23 and 24 respectively. As a result, a relaxation time τ1 during which the temperature becomes an equilibrium condition between the part 20 and the part 22 and between the part 21 and the part 22 is longer than a relaxation time τ0 of the case of the first embodiment in which the side part 19 does not have a groove. It can be considered that this is equivalent to a case where the width T of the side part 19 is increased to a width T1 as shown by an imaginary line 19' in FIG. 2C. Accordingly, the piezoelectric vibration element 11 of the present modification has a relaxation vibration frequency f10 which is expressed as f10 is lower than the relaxation vibration frequency f0 which is expressed as f0=1/(2πτ0) of the first embodiment.

Figure 10:
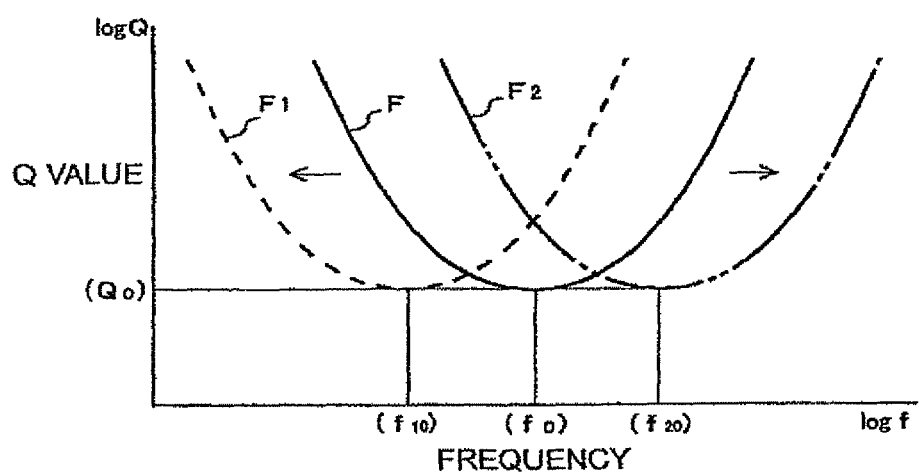
FIG. 10 is a graph showing a relationship between relaxation frequency and a minimum value of a Q value in a piezoelectric vibration element of a flexural vibration mode.
Figure 11A:
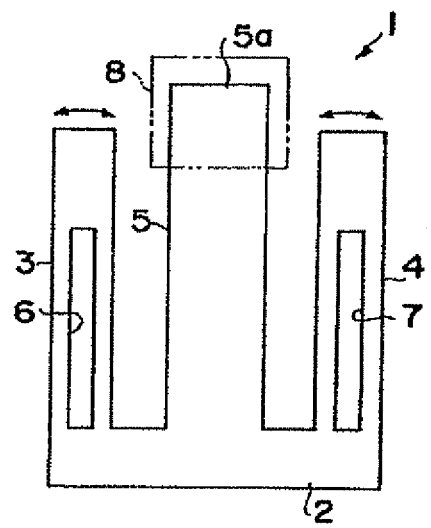
FIG. 11A is a plan view showing a piezoelectric vibration element of a related art.
Figure 11B:
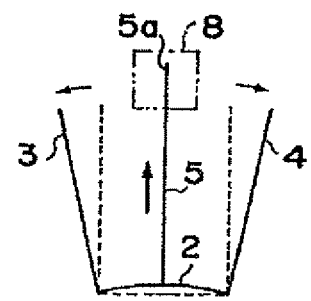
FIGS. 11B and 11C are schematic views showing deformation of vibrating arms due to flexural vibration.
Figure 11C:
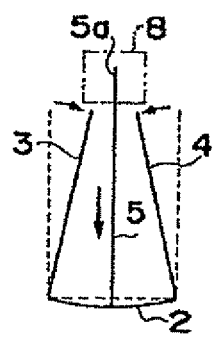

In view of a relationship between a frequency and a Q value in FIG. 10, a shape of a curve F is not changed, so that it can be considered that the curve F is shifted to a position of a curve F1, which is in a frequency lowering direction, with the lowering of the relaxation vibration frequency. Accordingly, in a range that a desired using frequency is higher than the vibration frequency f0, the Q value is always higher than the minimum value Q0 of the first embodiment. As above, by providing the grooves 23 and 24 having the bottoms on the side part 19, mechanical loss of vibration energy and thermoelastic loss can be suppressed and the Q value is further improved. Thus, high performance of the piezoelectric vibration element 11 can be achieved. Further, a similar advantageous effect can be obtained in a case where the grooves having bottoms are provided only one of the front surface and the rear surface of the side part 19.

Second Modification of First Embodiment

FIGS. 3A and 3B show a second modification of the first embodiment. A different point of the second modification from the first modification is that the side part 19 of the second modification is provided with a groove 25 which penetrates through front and rear surfaces of the side part 19 (hereinafter, also referred to as a through groove 25) instead of the groove having a bottom. The part 20 (21) at the inner side in the width direction of the side part 19 is separated from the part 22 at the outer side by the through groove 25.

As is the case of FIGS. 2A to 2C, when the vibrating arms bend and vibrate in a direction closer to or away from each other in the horizontal direction, the side part 19 bends and deforms in the horizontal direction. Inside the side part, compressive stress and tensile stress occur depending on a direction of the bend of the side part. A temperature increases at a compressive part, on which the compressive stress acts, of the side part 19, and a temperature decreases at a tensile part on which the tensile stress acts.

FIG. 3B shows a case where the vibrating arms bend away from each other, and accordingly the inner side in the width direction of the side part 19 is compressed and the outer side is extended. In the drawing, a degree of temperature-increase is expressed by the number of symbols: +, and a degree of temperature-decrease is expressed by the number of symbols:−. Regarding the whole of the side part 19, the temperature increases at the part 20 (21) at the compressive side and a temperature decreases at the part 22 at the tensile side. Since the through groove 25 is formed in the second modification, heat transfer does not occur between the part 20 (21) at the inner side in the width direction of the side part 19 and the part 22 at the outer side.

In a local view, in a first part at a vibration element body side across the groove 25 in the width direction of the side part 19, a magnitude of compressive stress acting on an inner side in the width direction of the first part is different from that acting on a groove 25 side of the first part. In the first part, the temperature-increase is larger at the inner side, that is, at the vibration element body side at which the compressive stress is larger, and the temperature-increase is small at the groove 25 side at which the compressive stress is smaller. Accordingly, in the inside of the first part, temperature gradient from the inner side (++) to the groove 25 side (+) is generated due to the relative difference between the temperature-increases, and heat transfer occurs along the temperature gradient.

In a similar manner, in a second part opposed to the first part, which is positioned at the vibration element body side, across the groove 25 in the width direction of the side part 19 as well, a magnitude of tensile stress acting on an outer side in the width direction of the second part is different from that acting on the groove 25 side of the second part. In the second part, the temperature-decrease is larger at the outer side at which the tensile stress is larger, that is, at the opposite side to the vibration element body side, and the temperature-decrease is smaller at the groove 25 side at which the tensile stress is smaller. Accordingly, in the inside of the second part, temperature gradient from the groove 25 side (-) to the outer side (--) is generated due to the relative difference between the temperature-decreases, and heat transfer occurs along the temperature gradient.

In an opposite manner, in a case where the vibrating arms bend closer to each other, the inner side in the width direction of the side part 19 is extended and the outer side is compressed. Accordingly, regarding the whole of the side part 19, the temperature increases at the part 22 at the compressive side and the temperature decreases at the part 20 (21) at the tensile side. When parts at both sides in the width direction of the side part 19 across the groove 25 are locally viewed, temperature gradient from the outer side toward the groove 25 occurs in one part and temperature gradient from the groove 25 side to the inner side occurs in the other part, and heat transfer occurs along the respective temperature gradients.

In the second modification, a heat transfer path at each of the parts at the both sides in the width direction of the side part 19 is substantially shorter than that of the first embodiment due to the through groove 25. As a result, a relaxation time τ2 during which the temperature becomes an equilibrium condition on each of the parts is shorter than the relaxation time τ0 of the first embodiment which does not have a through groove. It can be considered that this is equivalent to a case where the width T of the side part 19 is decreased to a width T2 of each of the parts which are separated by the through groove 25. Accordingly, the piezoelectric vibration element of the second modification has a relaxation vibration frequency f20 which is expressed as $f20=1/(2\pi\tau2)$. Since $\tau2<\tau0$ is satisfied, the relaxation vibration frequency f20 is higher than the relaxation vibration frequency f0 which is expressed as $f0=1/(2\pi\tau0)$ of the first embodiment.

In view of the relationship between a frequency and a Q value in FIG. 10, the shape of the curve F is not changed, so that it can be considered that the curve F is shifted to a position of a curve F2, which is in a frequency rising direction, with the rise of the relaxation vibration frequency. Accordingly, in a range that a desired using frequency is lower than the vibration frequency f0, the Q value is always higher than the minimum value Q0 of the first embodiment. As above, by providing the through groove 25 on the side part 19, mechanical loss of vibration energy and thermoelastic loss can be suppressed and the Q value is further improved. Thus, high performance of the piezoelectric vibration element of the second modification can be achieved as is the case with the first modification shown in FIGS. 2A to 2C.

FIG. 4 shows a piezoelectric device provided with the piezoelectric vibration element 11 of the first embodiment or the first or second modification of the second embodiment. This piezoelectric device 31 includes a base 32 having a rectangular box shape and formed by layering thin plates made of an insulating material, and a lid 33 having a planar shape. The piezoelectric vibration element 11 is mounted in a space 34 of the base 32 in a manner to be fixed to mounts 35 and 36 at its both side parts adjacent to the side part 19 of the frame body 18 with a conductive adhesive or the like. By bonding the lid 33 on an upper end of the base 32, the piezoelectric vibration element 11 is air-tightly sealed inside the piezoelectric device 31. Here, the base 32 and the lid 33 may have different shapes. For example, the base 32 may have a planar shape and the lid 33 may have a box shape, or the base 32 and the lid 33 both may have a box shape, so as to form a space for mounting the piezoelectric vibration element 11 therein.

Second Embodiment

Figure 5A:
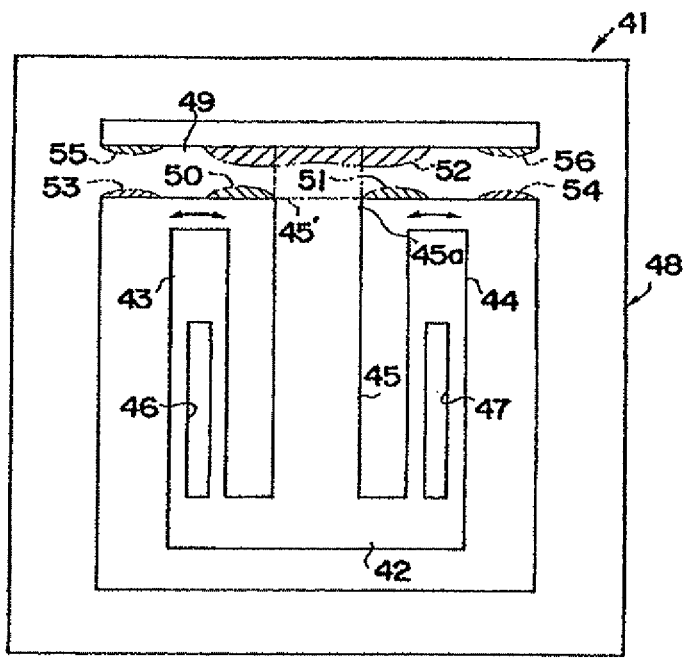
FIG. 5A is a plan view showing a piezoelectric vibration element of a second embodiment of the invention.

FIG. 5A is a schematic view showing a structure of a piezoelectric vibration element, according to a second embodiment, to which the present invention is applied. In a similar manner to the first embodiment, a piezoelectric vibration element 41 according to the second embodiment includes a vibration element body composed of a connecting part 42, two vibrating arms 43 and 44 which extend from the connecting part 42 in parallel, and one central supporting arm 45. The central supporting arm 45 extends from the connecting part 42 between the vibrating arms 13 and 14 in parallel with the arms 13 and 14 at equal distance from the arms 13 and 14. A linearly shaped long groove 46 is formed on each of a front surface and a rear surface of the vibrating arm 43 and a linearly shaped long groove 47 is formed on each of a front surface and a rear surface of the vibrating arm 44, so as to control a crystal impedance (CI) value.

The piezoelectric vibration element 41 further includes a frame body 48 having a rectangular shape and disposed at the outside of the vibration element body. The frame body 48 of the second embodiment has a supporting part 49 which is a bar extending between a pair of side parts which are positioned respectively at right and left sides of the drawing to be opposed to each other. The supporting part 49 is disposed to be adjacent to one side part (upper side in the drawing) of the frame body 48 in parallel with the one side part. The central supporting arm 45 is integrally connected with the supporting part 49 at an end part 45a thereof which is positioned opposite to the connecting part 42. Thus, the vibration element body is supported by the frame body 48 like a cantilever.

The piezoelectric vibration element 41 of the second embodiment is also composed of a so-called Z-cut quartz crystal thin plate which is set such that Y-axis of a quartz crystal axis is oriented in a longitudinal direction of the vibrating arms, X-axis is oriented in a width direction of the arms, and Z-axis is oriented in an orthogonal direction of the front surface and the rear surface of the vibration element, like a related art tuning-fork type quartz crystal vibration element. The piezoelectric vibration element 41 may be made of a piezoelectric material other than quartz crystal.

Though it is not shown, an excitation electrode is formed on surfaces, including inner surfaces of the grooves 46 and 47, of the vibrating arms 43 and 44. When a predetermined voltage is applied to the excitation electrode in a state that the vibration element body is supported by the frame body 48 at the central supporting arm 45 thereof as a cantilever as described above, the vibrating arms 43 and 44 bend and vibrate closer to and away from each other in a horizontal direction as shown by arrows in the drawing.

Figure 5B:
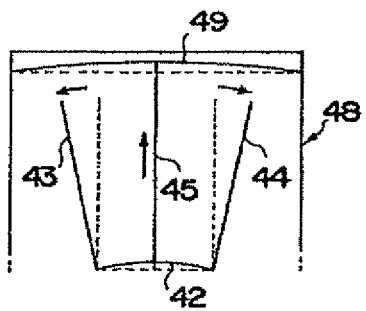
FIGS. 5B and 5C are schematic views showing deformation of vibrating arms due to flexural vibration.

Because of the flexural vibration of the vibrating arms 13 and 14, the supporting part 49 of the frame body 48 bends and deforms in the horizontal direction. As shown in FIG. 5B, when the vibrating arms 43 and 44 bend in a direction away from each other, the whole of the connecting part 42 bends toward the end part 45a of the central supporting arm 45. Accordingly, the central supporting arm 45 receives stress compressing the arm 45 toward the end part 45a, bending the supporting part 49 toward the side part, adjacent to the part 49, of the frame body 48. Therefore, compressive stress acts along an inner side, in a width direction, of the supporting part 49, especially, acts on parts 50 and 51 close to a part 45' at which the central supporting arm 45 is connected with the supporting part 49. Tensile stress acts along an outer side, in the width direction, of the supporting part 49 from the part 45' as a center toward the both ends of the supporting part 49, that is, acts on a part 52 which roughly corresponds to the parts 50 and 51. Further, around connecting portions of the supporting part 49 with the frame body 48, tensile stress acts on parts 53 and 54 at an inner side in the width direction of the supporting part 49 and compressive stress acts on parts 55 and 56 at an outer side of the part 49.

Figure 5C:
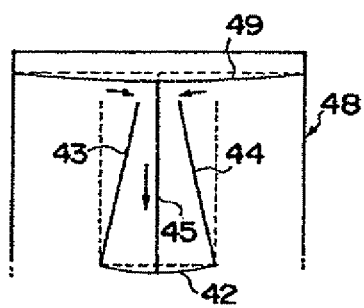

In an opposite manner, as shown in FIG. 5C, when the vibrating arms 43 and 44 bend in a direction in which the arms come closer to each other, the whole of the connecting part 42 bends in a direction opposite to the end part 45a of the central supporting arm 45. The central supporting arm 45 receives stress pulling the arm 45 from the end part 45a, bending the supporting part 49 toward the vibration element body. Therefore, tensile stress acts along the inner side in the width direction of the supporting part 49, especially, acts on the parts 50 and 51 close to the part 45' at which the central supporting arm 45 is connected with the supporting part 49. Compressive stress acts along an outer side, in the width direction, of the supporting part 49 from the part 45' as a center toward the both ends of the supporting part 49, that is, acts on the part 52 which roughly corresponds to the parts 50 and 51. Further, around the connecting portions of the supporting part 49 with the frame body 48, compressive stress acts on the parts 53 and 54 at the inner side in the width direction of the supporting part 49 and tensile stress acts on the parts 55 and 56 at the outer side of the part 49.

In contrast, compressive stress and tensile stress due to the vibrating arms 43 and 44 hardly occur in each of the side parts of the frame body 48. Accordingly, when the piezoelectric vibration element 41 is supported in a package or the like by fixing the side parts of the frame body 48 thereof to the package or the like, vibration leak of the vibrating arms can be prevented or suppressed. Thus performance of the piezoelectric vibration element 41 can be improved.

First Modification of Second Embodiment

FIGS. 6A to 6D show a first modification of the second embodiment. A piezoelectric vibration element 41 of the first modification differs from the piezoelectric vibration element 41 of the second embodiment at a point that the element of the first modification has grooves 57, 58, 59, and 60 along the supporting part 49. The grooves 57, 58, 59, and 60 are respectively disposed between the part 50 at the inner side, in the width direction, of the supporting part 49 and the part 52 at the outer side of the same, between the part 51 at the inner side and the part 52, between the part 53 at the inner side and the part 55, and between the part 54 at the inner side and the part 56 at the outer side, at equal distance from peripheries of the supporting part 49. As described according to the second embodiment above, compressive stress and tensile stress occur alternately at the supporting part 49 due to the flexural vibration of the vibrating arms 43 and 44.

Figure 6A:
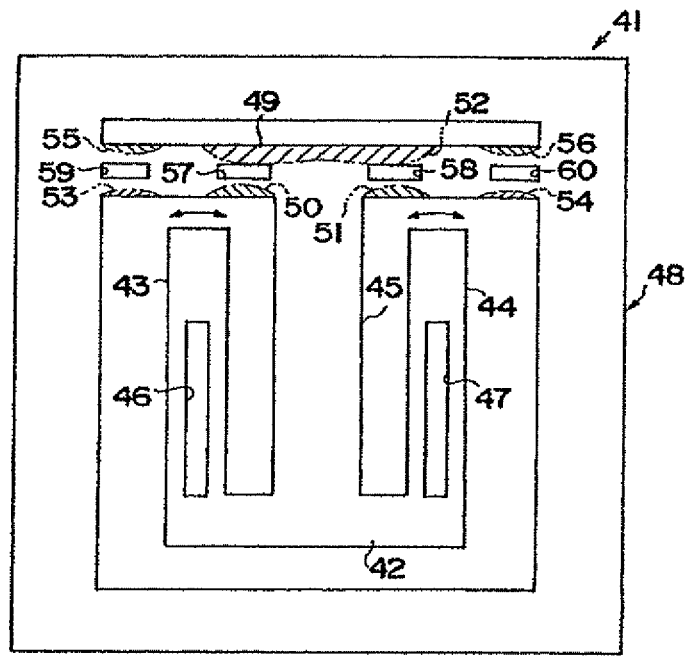
FIG. 6A is a plan view showing a piezoelectric vibration element of a first modification of the second embodiment.
Figure 6B:
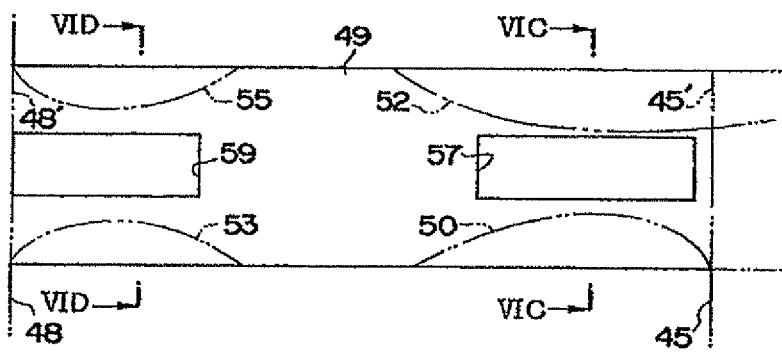
FIG. 6B is a partially-enlarged plan view showing a supporting part of a frame body.
Figure 6C:
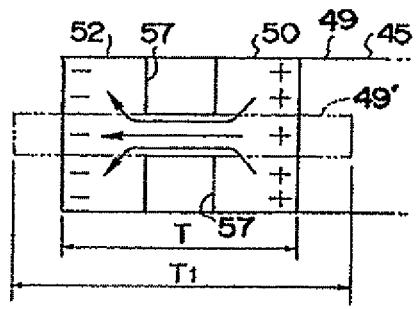
FIGS. 6C and 6D are sectional views respectively taken along a VIc-VIc line of FIG. 6B and along a VId-VId line of FIG. 6B.
Figure 6D:
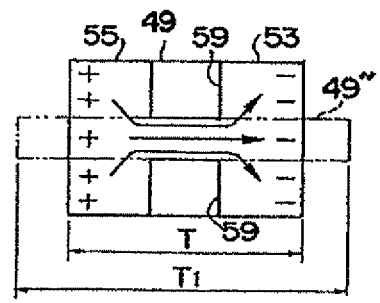

FIG. 6C shows a case where the part 50 (51) at the inner side in the width direction of the supporting part 49 becomes a compressive side and the part 52 at the outer side becomes a tensile side when the vibrating arms bend away from each other. FIG. 6D shows a case where the part 55 (56) at the outer side in the width direction of the supporting part 49 becomes a compressive side and the part 53 (54) at the inner side becomes a tensile side when the vibrating arms bend away from each other. As shown in FIGS. 6C and 6D, the grooves 57 to 60 have bottoms at the same depths from each of front and rear surfaces of the supporting part 49. In the drawing, + denotes temperature-increase, and − denotes temperature-decrease. Across the groove 57 (58), a temperature increases at the part 50 (51) at the compressive side and a temperature decreases at the part 52 at the tensile side. In a similar manner, across the groove 59 (60), a temperature increases at the part 55 (56) at the compressive side and a temperature decreases at the part 53 (54) at the tensile side. Because of these temperature gradients, heat transfer occurs from the part 50 (51) at the compressive side through a part at the groove 57 (58) to the part 52 at the tensile side (−) and from the part 55 (56) at the compressive side through a part at the groove 59 (60) to the part 53 (54) at the tensile side respectively.

In an opposite manner, when the vibrating arms bend closer to each other, the parts 50 and 51 at the inner side in the width direction of the supporting part 49 and the parts 55 and 56 at the outer side become a tensile side, and the part 52 at the outer side and the parts 53 and 54 at the inner side become a compressive side. The temperature increases at the parts 52, 53, and 54 at the compressive side, and the temperature decreases at the parts 50, 51, 55, and 56 at the tensile side. Because of these temperature gradients, heat transfers from the part 52 at the compressive side through parts at the grooves 57 and 58 respectively to the parts 50 and 51 at the tensile part, and from the parts 53 and 54 at the compressive side respectively through parts at the grooves 59 and 60 to the parts 55 and 56 at the tensile side. Thus the heat transfers in a direction opposite to the direction of the above case. Thus, the temperature gradient is generated between the part 50 at the inner side in the width direction of the supporting part 49 and the part 52 at the outer side, between the part 51 at the inner side and the part 52, between the part 53 at the inner side and the part 55 at the outer side, and between the part 54 at the inner side and the part 56 at the outer side respectively, depending on a direction in which the vibrating arms bend closer to or away from each other, and the heat transfer occurs depending on the temperature gradient.

Heat transfer paths between the part 50 and the part 52, between the part 51 and the part 52, between the part 53 and the part 55, and between the part 54 and the part 56 are narrowed at intermediate parts thereof respectively by the grooves 57, 58, 59, and 60. As a result, a relaxation time τ1 during which the temperature becomes an equilibrium condition between the part 50 and the part 52, between the part 51 and the part 22, between the part 55 and the part 53, and between the part 56 and the part 54 is longer than a relaxation time τ0 of the case of the second embodiment in which the supporting part 49 does not have a groove. It can be considered that this is equivalent to a case where the width T of the supporting part 49 is increased to a width T1 as shown by imaginary lines 49' and 49" respectively in FIGS. 6C and 6D. Accordingly, the piezoelectric vibration element 41 of the present modification has a relaxation vibration frequency f10 which is expressed as $f10=1(2\pi\tau=1)$. Since $\tau1>\tau0$ is satisfied, the relaxation vibration frequency f10 is lower than the relaxation vibration frequency f0 which is expressed as $f0=1/(2\pi\tau0)$ of the second embodiment.

In view of the relationship between a frequency and a Q value in FIG. 10, the shape of the curve F is not changed, so that it can be considered that the curve F is shifted to the position of the curve F1, which is in a frequency lowering direction, with the lowering of the relaxation vibration frequency. Accordingly, in a range that a desired using frequency is higher than the vibration frequency f0, the Q value is always higher than the minimum value Q0 of the second embodiment. By providing the grooves 57 to 60 having the bottoms on the supporting part 49 of the piezoelectric vibration element 41 as above, mechanical loss of vibration energy and thermoelastic loss can be suppressed and the Q value is further improved. Thus, high performance of the piezoelectric vibration element 41 can be achieved. Here, the same advantageous effect can be offered also in a case where the grooves having bottoms are formed one of the front surface and the rear surface of the supporting part 49.

Second Modification of Second Embodiment

Figure 7A:
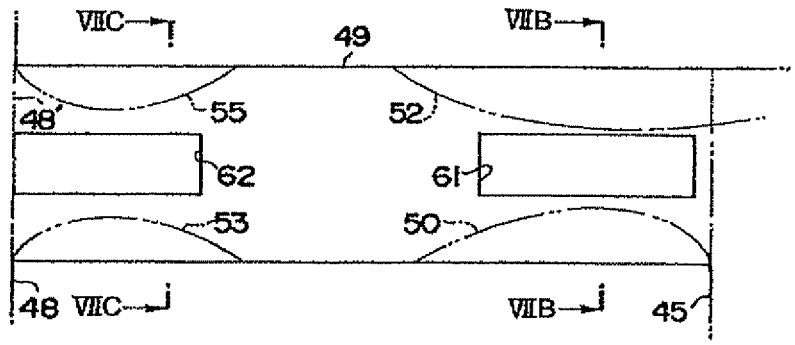
FIG. 7A is a partially-enlarged plan view showing a supporting part of a frame body of a piezoelectric vibration element of a second modification of the second embodiment.
Figure 7B:
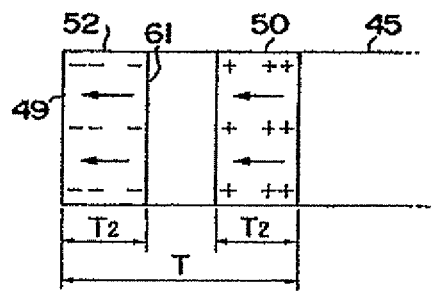
FIGS. 7B and 7C are sectional views respectively taken along a VIIb-VIIb line of FIG. 7A and along a VIIc-VIIc line of FIG. 7A.

FIGS. 7A and 7B show a second modification of the second embodiment. A different point of the second modification from the first modification shown in FIGS. 6A to 6D is that the supporting part 49 of the second modification has grooves 61 and 62 which penetrate from a front surface through to a rear surface of the supporting part 49 (hereinafter, also referred to as through grooves 61 and 62) instead of the grooves having bottoms. The part 50 (51) at the inner side in the width direction of the supporting part 49 is separated from the part 52 at the outer side by the through groove 61 and the part 53 (54) at the inner side is separated from the part 55 (56) at the outer side by the through groove 62.

As is the case of FIGS. 6A to 6D, when the vibrating arms bend and vibrate in a direction closer to or away from each other in the horizontal direction, the supporting part 49 bends and deforms in the horizontal direction. Inside the supporting part 49, compressive stress and tensile stress occur depending on a direction of the bend of the supporting part 49. A temperature increases at a compressive part, on which the compressive stress acts, of the supporting part 49, and a temperature decreases at a tensile part on which the tensile stress acts.

Figure 7C:
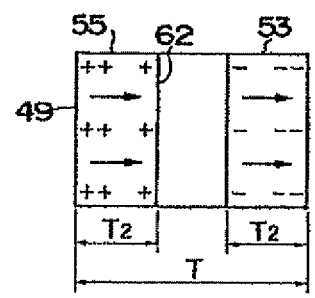

FIG. 7B shows a case where the part 50 (51) at the inner side in the width direction of the supporting part 49 becomes a compressive side and the part 52 at the outer side becomes a tensile side around a connecting part 45' at which the central supporting arm 45 is connected with the supporting part 49, when the vibrating arms bend away from each other. FIG. 7C shows a case where the part 55 (56) at the outer side in the width direction of the supporting part 49 becomes a compressive side and the part 53 (54) at the inner side becomes a tensile side, around connecting parts of the supporting part 49 with the side part of the frame body 48. In the drawing, a degree of temperature-increase is expressed by the number of symbols: +, and a degree of temperature-decrease is expressed by the number of symbols: −. Regarding the whole of the supporting part 49, the temperature increases at the part 50 (51) and the part 55 (56) at the compressive sides and a temperature decreases at the part 52 and the part 53 (54) at the tensile sides. Since the through grooves 61 and 62 are formed in the second modification, heat transfer does not occur between the part 50 (51) at the inner side and the part 52 at the outer side and between the part 53 (54) at the inner side and the part 55 (56) at the outer side.

In a local view, in a first part at a vibration element body side of the supporting part 49 across the groove 61 in the width direction of the supporting part 49, a magnitude of compressive stress acting on an inner side (vibration element body side) in the width direction of the first part is different from that acting on a groove 61 side of the first part. In the first part, the temperature-increase is larger at the inner side, that is, at the vibration element body side at which the compressive stress is larger, and the temperature-increase is smaller at the groove 61 side at which the compressive stress is smaller, as shown in FIG. 7B. Accordingly, in the inside of the first part, temperature gradient from the inner side (++) to the groove 61 side (+) is generated due to the relative difference between the temperature-increases, and heat transfer occurs along the temperature gradient.

In a similar manner, in a second part opposed to the first part across the groove 61 in the width direction of the supporting part 49 as well, a magnitude of tensile stress acting on an outer side in the width direction of the second part is different from that acting on the groove 61 side of the second part. In the second part, the temperature-decrease is larger at the outer side at which the tensile stress is larger, that is, at the opposite side to the vibration element body side, and the temperature-decrease is smaller at the groove 61 side at which the tensile stress is smaller. Accordingly, in the inside of the second part, temperature gradient from the groove 61 side (−) to the outer side (−−) is generated due to the relative difference between the temperature-decreases, and heat transfer occurs along the temperature gradient.

In a similar manner, in a third part opposed to a part, which is positioned at the vibration element body side, across the groove 62 in the width direction of the supporting part 49, a magnitude of compressive stress acting on an outer side in the width direction of the third part is different from that acting on a groove 62 side of the third part. In the third part, the temperature-increase is larger at the outer side at which the compressive stress is larger, that is, at an opposite side to the vibration element body side, and the temperature-increase is smaller at the groove 62 side at which the compressive stress is smaller, as shown in FIG. 7C. Accordingly, in the inside of the third part, temperature gradient from the outer side (++) to the groove 62 side (+) is generated due to the relative difference between the temperature-increases, and heat transfer occurs along the temperature gradient.

In a similar manner, in a fourth part at the vibration element body side across the groove 62 in the width direction of the supporting part 49 as well, a magnitude of tensile stress acting on an outer side in the width direction of the fourth part is different from that acting on a groove 62 side of the fourth part. In the fourth part, the temperature-decrease is larger at the inner side at which the tensile stress is larger, that is, at the vibration element body side, and the temperature-decrease is smaller at the groove 62 side at which the tensile stress is smaller. Accordingly, in the inside of the fourth part, temperature gradient from the groove 62 side (−) to the inner side (−−) is generated due to the relative difference between the temperature-decreases, and heat transfer occurs along the temperature gradient.

In an opposite manner, when the vibrating arms bend closer to each other, the inner side in the width direction of the supporting part 49 is extended and the outer side is compressed around the connecting part 45' at which the central supporting arm 45 is connected with the supporting part 49. Around the connecting portions of the supporting part 49 with the side part of the frame body 48, the inner side in the width direction is compressed and the outer side is extended. Accordingly, regarding the whole of the supporting part 49, the temperature increases at the parts 52, 53, and 54 at the compressive sides and the temperature decreases at the parts 50, 51, 55, and 56 at the tensile sides.

In a local view, in the second part, which is at the opposite side to the vibration element body side, across the groove 61 in the width direction of the supporting part 49, the magnitude of compressive stress acting on the outer side in the width direction of the second part is different from that acting on the groove 61 side of the second part. In the second part, the temperature-increase is larger at the outer side at which the compressive stress is larger, that is, at the opposite side to the vibration element body side, and the temperature-increase is smaller at the groove 61 side at which the compressive stress is smaller. Thus, in the inside of the second part, temperature gradient from the outer side to the groove 61 side is generated due to the relative difference between the temperature-increases, and heat transfer occurs along the temperature gradient.

In a similar manner, in the first part at the vibration element body side across the groove 61 in the width direction of the supporting part 49 as well, the magnitude of tensile stress acting on the inner side in the width direction of the first part is different from that acting on the groove 61 side of the first part. In the first part, the temperature-decrease is larger at the inner side at which the tensile stress is larger, that is, at the vibration element body side, and the temperature-decrease is smaller at the groove 61 side at which the tensile stress is smaller. Thus, in the inside of the first part, temperature gradient from the groove 61 side to the inner side is generated due to the relative difference between the temperature-decreases, and heat transfer occurs along the temperature gradient.

In a similar manner, in the fourth part at the vibration element body side across the groove 62 in the width direction of the supporting part 49, the magnitude of compressive stress acting on the inner side in the width direction of the fourth part is different from that acting on the groove 62 side of the fourth part. In the fourth part, the temperature-increase is larger at the inner side at which the compressive stress is larger, that is, at the vibration element body side, and the temperature-increase is smaller at the groove 62 side at which the compressive stress is smaller. Thus, in the inside of the fourth part, temperature gradient from the inner side to the groove 62 side is generated due to the relative difference between the temperature-increases, and heat transfer occurs along the temperature gradient.

In a similar manner, in the third part opposed to the fourth part across the groove 62 in the width direction of the supporting part 49 as well, the magnitude of tensile stress acting on the outer side in the width direction of the third part is different from that acting on the groove 62 side of the third part. In the third part, the temperature-decrease is larger at the outer side at which the tensile stress is larger, that is, at the opposite side to the vibration element body side, and the temperature-decrease is smaller at the groove 62 side at which the tensile stress is smaller. Thus, in the inside of the third part, temperature gradient from the groove 62 side to the outer side is generated due to the relative difference between the temperature-decreases, and heat transfer occurs along the temperature gradient.

In the second modification, a heat transfer path inside each of the first to fourth parts at the inner side and the outer side in the width direction of the supporting part 49 is substantially shortened by the through grooves 61 and 62 compared to the second embodiment. As a result, a relaxation time $\tau 2$ during which the temperature becomes an equilibrium condition on each of the parts is shorter than the relaxation time $\tau 0$ of the second embodiment which does not have a through groove. It can be considered that this is equivalent to a case where the width T of the supporting part 49 is decreased to a width T2 of each of the first part and the second part which are separated by the through groove 61 and the third part and the fourth part which are separated by the through groove 62. Accordingly, the piezoelectric vibration element of the second modification has a relaxation vibration frequency f20 which is expressed as $f20=1/(2\pi\tau 2)$. Since $\tau 2<\tau 0$ is satisfied, the relaxation vibration frequency f20 is higher than the relaxation vibration frequency f0, which is expressed as $f0=1/(2\pi\tau 0)$, of a related art structure.

In view of the relationship between a frequency and a Q value in FIG. 10, the shape of the curve F is not changed, so that it can be considered that the curve F is shifted to a position of the curve F2, which is in a frequency rising direction, with the rise of the relaxation vibration frequency. Accordingly, in a range that a desired using frequency is lower than the vibration frequency f0, the Q value is always higher than the minimum value Q0 of the second embodiment. By providing the through grooves 61 and 62 on the supporting part 49 as above, mechanical loss of vibration energy and thermoelastic loss can be suppressed and the Q value is further improved. Thus, high performance of the piezoelectric vibration element of the second modification can be achieved as is the case with the first modification shown in FIGS. 6A to 6D.

Figure 8:
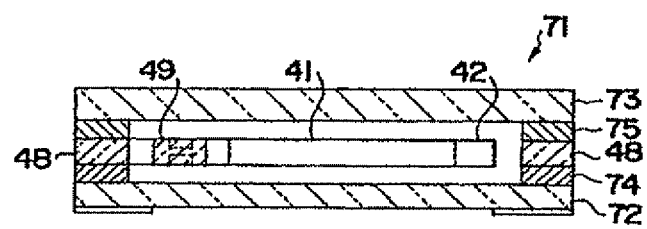
FIG. 8 is a longitudinal sectional view showing a piezoelectric device provided with the piezoelectric vibration element of the second embodiment.

FIG. 8 shows a piezoelectric device provided with the piezoelectric vibration element 41 of the second embodiment or the first or second modification of the second embodiment. This piezoelectric device 71 includes a base 72 disposed under the piezoelectric vibration element 41 and having a planar shape, and a lid 73 disposed above the piezoelectric vibration element 41 and having a planar shape. The piezoelectric vibration element 41 is air-tightly bonded to the base 72 and the lid 73 respectively at a lower surface and an upper surface of the frame body 48 with sealants 74 and 75 made of low-melting glass. Accordingly, the vibration element body is supported by the supporting part 49 as a cantilever and is air-tightly sealed inside the piezoelectric device 71. Here, the shapes of the base 72 and the lid 73 are not limited to the planar shape. For example, the peripheries, which are bonded with the frame body 48 of the piezoelectric vibration element 41, of the base and the lid may be formed thick, or a groove, a concave part, or a convex part may be formed on surfaces facing the piezoelectric vibration element or outer surfaces of the base and the lid.

Figure 9:
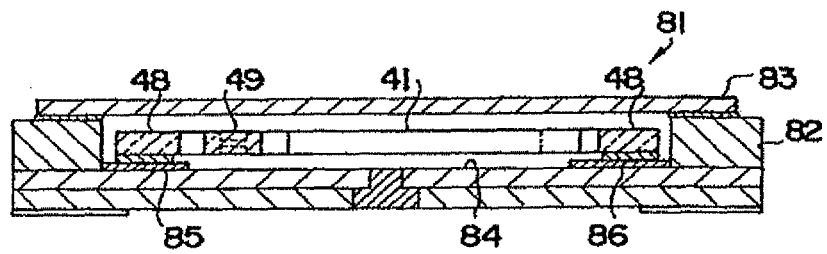
FIG. 9 is a longitudinal sectional view showing another piezoelectric device provided with the piezoelectric vibration element of the second embodiment.

FIG. 9 shows another piezoelectric device provided with the piezoelectric vibration element 41 of the second embodiment or the first or second modification of the second embodiment. This piezoelectric device 81 includes a base 82 having a rectangular box shape and formed by layering thin plates made of an insulating material, and a lid 83 having a planar shape. The piezoelectric vibration element 41 is mounted inside a space 84 of the base 82 by fixing the frame body 48 on mounts 85 and 86 with a conductive adhesive or the like. By bonding the lid 83 on an upper end of the base 82, the piezoelectric vibration element 41 is air-tightly sealed inside the piezoelectric device 81. Here, the base 82 and the lid 83 may have different shapes. For example, the base 82 may have a planar shape and the lid 83 may have a box shape, or the base 82 and the lid 83 both may have a box shape, so as to form a space for mounting the piezoelectric vibration element 41 therein.

The invention is not limited to the above embodiments but may be embodied by adding various kinds of modifications and alterations without departing from the technical scope of the invention. For example, the present invention is applicable to a piezoelectric vibration element in which three or more vibrating arms extend from a connecting part. Further, a flexural vibration element of the above embodiments is formed in one body with the piezoelectric material, but may be formed by providing a piezoelectric plate material on a surface of a silicon semiconductor or the like. Further, the present invention is applicable not only to a flexural vibration element of a piezoelectric driving type but also to that of an electrostatic driving type or a magnetic driving type. In this case, the flexural vibration element may be made of a known material such as silicon semiconductor as well as the piezoelectric material. Further, the flexural vibration element of the invention is applicable to various electronic components as well as the piezoelectric device.

The entire disclosure of Japanese Patent Application No. 2008-335550, filed Dec. 27, 2008 is expressly incorporated by reference herein.

What is claimed is:
1. A flexural vibration element comprising:
  a vibration element body composed of a plurality of vibrating arms provided in parallel, a connecting part connecting the vibrating arms, and one central supporting arm extending between the vibrating arms from the connect- ing part in parallel with the vibrating arms at equal distance from the vibrating arms; and a frame body disposed outside the vibration element body, the frame body being a rectangular frame that completely surrounds the vibration element body in plan view, the vibration element body being supported by the frame body at an end part of the central supporting arm, the end part being opposite to the connecting part, the vibrating arms, the connecting part, the central supporting arm and the frame body being integrally formed as one piece from a single material with a fixed positional relationship between the central supporting arm and the frame body, wherein the frame body has a supporting part, at an interior side thereof, extending between a pair of side parts thereof, and the end part, opposite to the connecting part, of the central supporting arm is connected to the supporting part so as to support the vibration element body.

2. The flexural vibration element according to claim 1, wherein the supporting part has a groove formed on at least one of a front surface and a rear surface thereof, and the groove is positioned in an area that is along the supporting part and in which compressive stress and tensile stress alternately occur at a vibration element body side of the supporting part and an opposite side to the vibration element body side due to flexural vibration of the vibrating arms.

3. The flexural vibration element according to claim 2, wherein the groove is formed between one end of the supporting part and a part of the same to which the central supporting arm is connected and between the other end of the supporting part and the part to which the central supporting arm is connected.

4. The flexural vibration element according to claim 2, wherein the groove has a bottom.

5. The flexural vibration element according to claim 2, wherein the groove is a through groove.

6. An electronic component, comprising:
the flexural vibration element of claim 1;
a base bonded to a lower surface of the frame body of the flexural vibration element; and
a lid bonded to an upper surface of the frame body, wherein the flexural vibration element is air-tightly sealed in a space formed by the base and the lid.

7. An electronic component; comprising:
the flexural vibration element of claim 1;
a base on which the flexural vibration element is disposed; and
a lid bonded with the base; wherein the flexural vibration element is fixed on the base at a side part of the frame body, and the flexural vibration element is air-tightly sealed in a space formed by the base and the lid.

* * * * *